US012672333B2

(12) United States Patent
Kang et al.

(10) Patent No.: US 12,672,333 B2
(45) Date of Patent: Jun. 30, 2026

(54) BACKSIDE PLACEHOLDER DIELECTRIC FILL

(71) Applicant: International Business Machines Corporation, Armonk, NY (US)

(72) Inventors: Tsung-Sheng Kang, Ballston Lake, NY (US); Tao Li, Slingerlands, NY (US); Ruilong Xie, Niskayuna, NY (US); Min Gyu Sung, Latham, NY (US)

(73) Assignee: International Business Machines Corporation, Armonk, NY (US)

( * ) Notice: Subject to any disclaimer, the term of this patent is extended or adjusted under 35 U.S.C. 154(b) by 427 days.

(21) Appl. No.: 18/536,590

(22) Filed: Dec. 12, 2023

(65) Prior Publication Data

US 2025/0194213 A1     Jun. 12, 2025

(51) Int. Cl.
| | |
|---|---|
| *H10D 64/23* | (2025.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |

(Continued)

(52) U.S. Cl.
CPC ......... *H10D 64/254* (2025.01); *H10D 30/014* (2025.01); *H10D 30/43* (2025.01); *H10D 30/6735* (2025.01); *H10D 30/6757* (2025.01); *H10D 62/121* (2025.01); *H10D 64/01* (2025.01); *H10W 10/014* (2026.01); *H10W 10/17* (2026.01)

(58) Field of Classification Search
CPC .. H10D 30/6735; H10D 30/00; H10D 30/501; H10D 30/60
See application file for complete search history.

(56) References Cited

U.S. PATENT DOCUMENTS

| | | | |
|---|---|---|---|
| 10,797,139 B2 | 10/2020 | Morrow et al. |
| 2005/0001276 A1 | 1/2005 | Gao et al. |

(Continued)

OTHER PUBLICATIONS

K. Booker et al., "Deep, vertical etching for GaAs using inductively coupled plasma/reactive ion etching." vol. 38, Issue 1. American Vacuum Society. Dec. 31, 2019. 7 Pages.

(Continued)

*Primary Examiner* — Christine S. Kim
*Assistant Examiner* — Andrew Victor Prostor
(74) *Attorney, Agent, or Firm* — Cantor Colburn LLP; Samuel Waldbaum

(57) ABSTRACT

Embodiments of the present disclosure are directed to processing methods and resulting structures for providing a backside placeholder dielectric fill to enable robust backside source/drain contacts. In a non-limiting embodiment, nanosheets having a first width are formed in a first region and nanosheets having a second width greater than the first width are formed in a second region. The first region includes a first S/D region and a second S/D region electrically coupled to a backside contact and a frontside contact, respectively. The second region includes a third S/D region and a fourth S/D region electrically coupled to a backside contact and a frontside contact, respectively. The method includes forming a backside placeholder having an air gap in the first region and forming a backside placeholder having a dimple in the second region.

20 Claims, 13 Drawing Sheets

(51) Int. Cl.
    *H10W 10/00*     (2026.01)
    *H10W 10/17*     (2026.01)

(56) References Cited

U.S. PATENT DOCUMENTS

| | | |
|---|---|---|
| 2021/0111115 A1 | 4/2021 | Morrow et al. |
| 2021/0134721 A1 | 5/2021 | Chiang et al. |
| 2021/0202385 A1 | 7/2021 | Huang et al. |
| 2021/0305252 A1 | 9/2021 | Chiang et al. |
| 2021/0305381 A1 | 9/2021 | Chiang et al. |
| 2021/0351303 A1 | 11/2021 | Ju et al. |
| 2021/0376071 A1 | 12/2021 | Liu et al. |
| 2021/0376093 A1 | 12/2021 | Chu et al. |
| 2022/0139911 A1 | 5/2022 | Wei et al. |
| 2022/0216340 A1* | 7/2022 | Lin ...................... H10D 84/013 |
| 2022/0367243 A1* | 11/2022 | Chang ................ H10D 84/0149 |
| 2022/0367705 A1 | 11/2022 | Yu et al. |
| 2022/0415904 A1 | 12/2022 | Sharma et al. |
| 2023/0068065 A1* | 3/2023 | Khaderbad .......... H10D 30/014 |
| 2023/0100113 A1 | 3/2023 | Xie et al. |
| 2023/0238284 A1 | 7/2023 | Huang et al. |
| 2023/0268389 A1* | 8/2023 | Jain ...................... H10D 62/118 |
| | | 257/288 |
| 2023/0387115 A1* | 11/2023 | Su ...................... H10D 30/6757 |
| 2023/0402519 A1* | 12/2023 | Anderson .......... H10D 84/0149 |
| 2023/0411386 A1* | 12/2023 | Xie ........................ H10D 84/83 |

OTHER PUBLICATIONS

O. Seok et al., "Micro-trench free 4H-SiC etching with improved SiC/SiO2 selectivity using inductively coupled SF6/02/Ar plasma." IOP Publishing Ltd. Feb. 14, 2020. 6 Pages.

S. Vitale et al., "High density plasma etching of titanium nitride metal gate electrodes for fully depleted silicon-on-insulator sub-threshold transistor integration." vol. 27, Issue 6. American Vacuum Society. Nov. 30, 2009. 9 Pages.

* cited by examiner

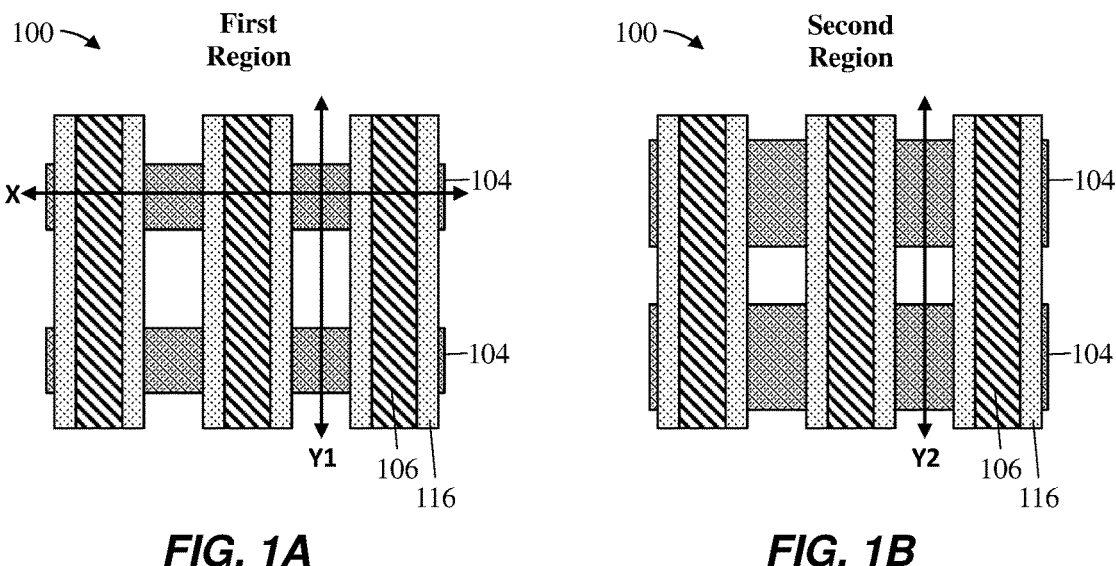
FIG. 1A
FIG. 1B
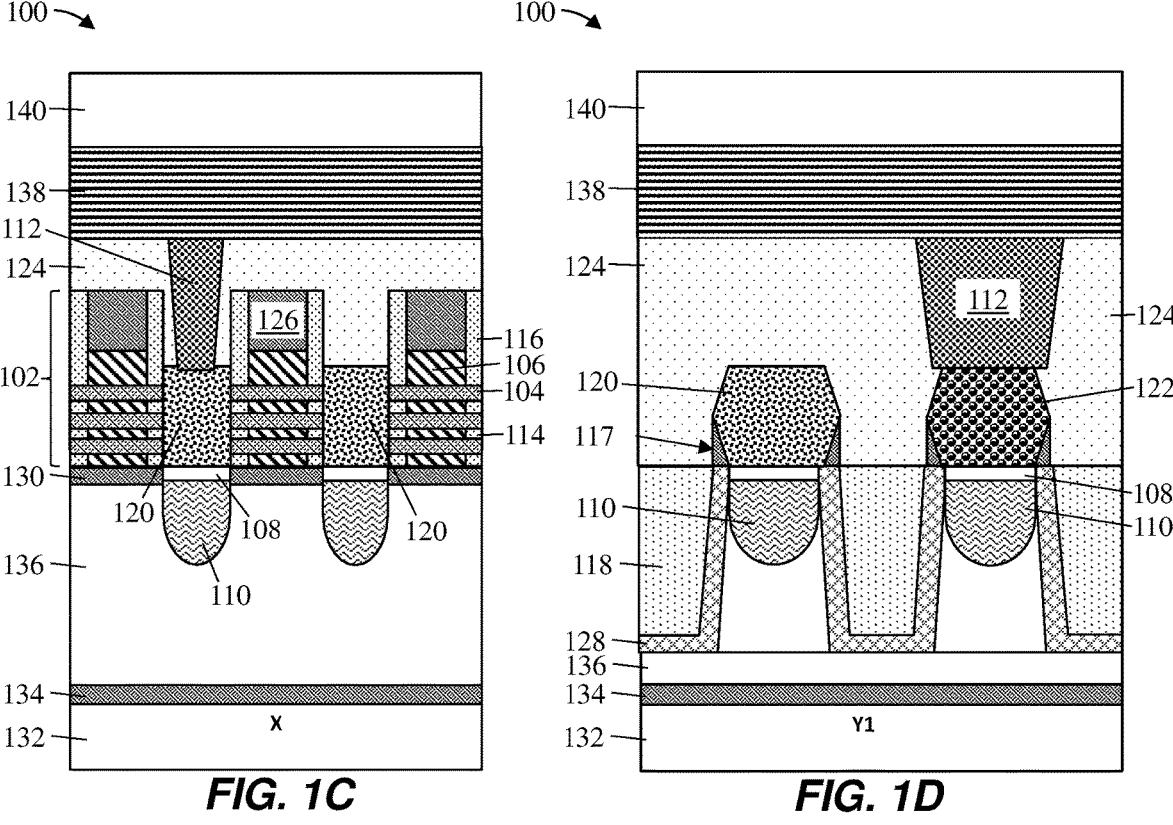
FIG. 1C
FIG. 1D

1300

FORM NANOSHEETS HAVING A FIRST WIDTH IN A FIRST REGION
1302

FORM NANOSHEETS HAVING A SECOND WIDTH GREATER THAN THE
FIRST WIDTH IN A SECOND REGION
1304

FORM A BACKSIDE PLACEHOLDER HAVING AN AIR GAP IN THE FIRST
REGION
1306

FORM A BACKSIDE PLACEHOLDER HAVING A DIMPLE IN THE SECOND
REGION
1308

BACKSIDE PLACEHOLDER DIELECTRIC FILL

BACKGROUND

The present disclosure generally relates to fabrication methods and resulting structures for semiconductor devices, and more specifically, to processing methods and resulting structures for providing a backside placeholder dielectric fill to enable robust backside source/drain contacts.

The development of an integrated circuit (i.e., chip) involves several stages from design through fabrication. Many aspects of the development are performed iteratively to ensure that the chip ultimately manufactured meets all design requirements. Defining the chip architecture is one of the earliest phases of integrated circuit development. The power (e.g., power requirement), performance (e.g., timing), and area (i.e., space needed) for the resulting chip, collectively PPA, is one of the primary metrics by which integrated circuits are evaluated. PPA is largely a consequence of the chip architecture.

Semiconductor fabrication continues to evolve towards improving one or more aspects of PPA. For example, a higher number of active devices (mainly transistors) of ever decreasing device dimensions are placed on a given surface of semiconductor material. Density scaling has put a strain on the design and fabrication of the interconnects between the front end of line of the integrated circuit, consisting mainly of the active devices, and the contact terminals of the integrated circuit. In many chip architectures, all of these interconnects are incorporated in the back end of line (BEOL) structure of the integrated circuit, which includes a stack of metallization layers and vertical via connections built on top of the front end of line (FEOL) structure.

A key component of the BEOL structure is the power delivery network (PDN). The PDN of an integrated circuit is defined by the conductors and vias connected to the power supply (VDD) and ground (VSS) terminals of the chip. The PDN is responsible for delivering power to the individual devices in the front end. The integration of the PDN in the BEOL has become particularly challenging as device densities continue to scale. Backside power delivery is one known solution to this problem, and involves moving some (or most, or all) layers of the PDN from the front side of the integrated circuit to the back side. In a backside-style architecture, the repositioned layers are not formed on top of the FEOL, but are instead formed on the opposite side of the chip (i.e., on the backside of the semiconductor substrate onto which the active devices have been built).

SUMMARY

Embodiments of the disclosure are directed to a method for providing a backside placeholder dielectric fill to enable robust backside source/drain contacts. A non-limiting example of the method includes forming nanosheets having a first width in a first region and forming nanosheets having a second width greater than the first width in a second region. The first region includes a first S/D region and a second S/D region electrically coupled to a backside contact and a frontside contact, respectively. The second region includes a third S/D region and a fourth S/D region electrically coupled to a backside contact and a frontside contact, respectively. The method includes forming a backside placeholder having an air gap in the first region and forming a backside placeholder having a dimple in the second region.

Embodiments of the disclosure are directed to a semiconductor structure. A non-limiting example of the semiconductor structure includes a first region including nanosheets having a first width and a second region including nanosheets having a second width greater than the first width. The first region further includes a first S/D region and a second S/D region. The first S/D region is electrically coupled to a backside contact and the second S/D region is electrically coupled to a frontside contact. The second region further includes a third S/D region and a fourth S/D region. The third S/D region is electrically coupled to a backside contact and the fourth S/D region is electrically coupled to a frontside contact. The structure further includes a backside placeholder having an air gap in the first region and a backside placeholder having a dimple in the second region.

Embodiments of the disclosure are directed to a semiconductor structure. A non-limiting example of the semiconductor structure includes a first region including nanosheets having a first width and a second region including nanosheets having a second width greater than the first width. The first region further includes a first S/D region and a second S/D region. The first S/D region is electrically coupled to a backside contact and the second S/D region is electrically coupled to a frontside contact. The second region further includes a third S/D region and a fourth S/D region. The third S/D region is electrically coupled to a backside contact and the fourth S/D region is electrically coupled to a frontside contact. The structure further includes a backside placeholder having a filled pocket in the first region. The filled pocket includes a same material as a backside interlayer dielectric positioned opposite the second S/D region on the backside placeholder. The structure further includes a backside placeholder having a dimple in the second region.

Additional technical features and benefits are realized through the techniques of the present disclosure. Embodiments and aspects of the disclosure are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the disclosure are apparent from the following detailed description taken in conjunction with the accompanying drawings in which:

FIGS. 1A and 1B depict top-down views of a first region and a second region, respectively, of a semiconductor wafer after an initial set of processing operations according to one or more embodiments;

FIGS. 1C and 1D depict cross-sectional views of the semiconductor wafer taken along the lines X (across gate in channel region) and Y1 (across source/drain in first region) in FIG. 1A, respectively, after the initial set of processing operations according to one or more embodiments;

Figures 2A, 2B, 2C:
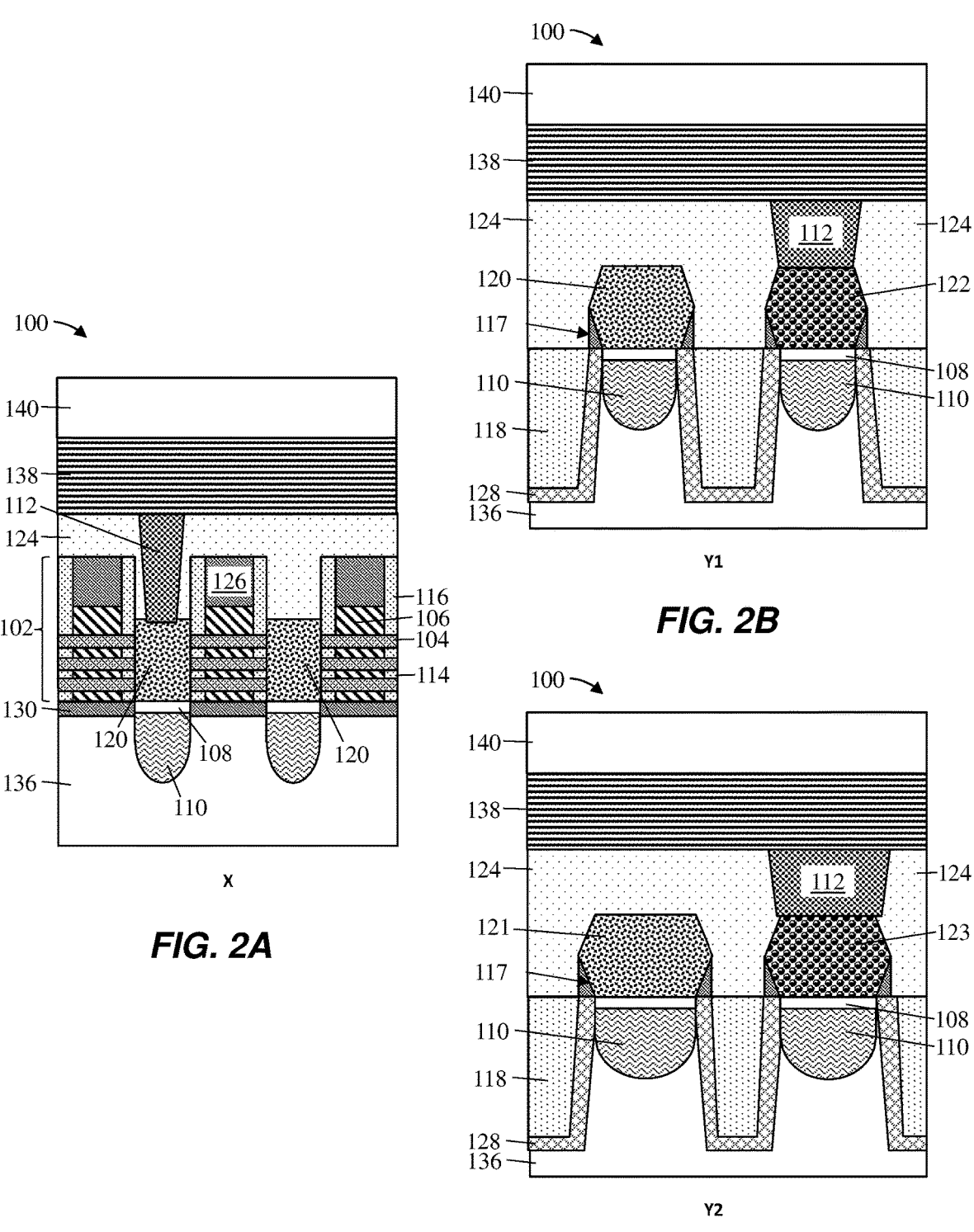
FIGS. 2A, 2B, and 2C depict cross-sectional views of the semiconductor wafer taken along the lines X, Y1, and Y2 (across source/drain in second region), respectively, after a processing operation according to one or more embodiments.

The diagrams depicted herein are illustrative. There can be many variations to the diagram or the operations described therein without departing from the spirit of the disclosure. For instance, the actions can be performed in a differing order or actions can be added, deleted or modified.

In the accompanying figures and following detailed description of the described embodiments of the disclosure, the various elements illustrated in the figures are provided with two or three-digit reference numbers. With minor exceptions, the leftmost digit(s) of each reference number correspond to the figure in which its element is first illustrated.

DETAILED DESCRIPTION

According to an aspect of the disclosure, there is provided a method for providing a backside placeholder dielectric fill to enable robust backside source/drain contacts in a semiconductor device. A non-limiting example method includes forming nanosheets having a first width in a first region and forming nanosheets having a second width greater than the first width in a second region. The first region includes a first S/D region and a second S/D region electrically coupled to a backside contact and a frontside contact, respectively. The second region includes a third S/D region and a fourth S/D region electrically coupled to a backside contact and a frontside contact, respectively. The method includes forming a backside placeholder having an air gap in the first region and forming a backside placeholder having a dimple in the second region. Advantageously, the respective backside placeholders prevent or mitigate damage to front-end-of-line (FEOL) structures during the fabrication process.

In some embodiments, the backside placeholder in the second region does not include an air gap. Advantageously, the backside placeholder in the second region provides a physical signature of a dielectric placeholder replacement process.

In some embodiments, the second S/D region is between the respective frontside contact and the respective backside placeholder in the first region. The second S/D region provides electrical continuity to the device frontside.

In some embodiments, the backside placeholder in the first region includes a dimple. The dimple in the backside placeholder in the first region provides another physical signature of the dielectric placeholder replacement process.

In some embodiments, forming the backside placeholder in the first region includes forming a first backside placeholder using a first material and replacing the first backside placeholder with a second backside placeholder made of a second material different than the first material. Advantageously, forming the backside placeholders in two stages in this manner allows for a substrate recess without damaging FEOL structures.

In some embodiments, the method includes recessing a semiconductor layer to expose a portion of the first backside placeholder. Advantageously, the semiconductor layer is only partially recessed to exposed the first backside placeholder, and remaining portions of the semiconductor layer prevent damage to FEOL structures.

In some embodiments, the method includes removing the first backside placeholder to define a backside placeholder trench. In some embodiments, the method includes filling the backside placeholder trench with the second material. Advantageously, the second material can include dielectrics and/or metals to provide robust backside protection.

In some embodiments, the air gap is formed when filling the backside placeholder trench with the second material. In some embodiments, the air gap is formed due to a pinch-off caused in part by remaining portions of the recessed semiconductor layer. The air gap provides a physical signature of the dielectric placeholder replacement process.

In some embodiments, the first backside placeholder is formed prior to forming a carrier wafer and flipping the semiconductor device, and the second backside placeholder is formed after forming the carrier wafer and flipping the semiconductor device. In this manner, the second backside placeholder can be built using dielectrics and/or metals post-wafer flip without requiring frontside planarization processes (e.g., CMPs) and/or recesses that can cause gate damage.

In some embodiments, the method includes forming a shallow trench isolation (STI) region and an STI liner on the STI region. In some embodiments, the backside placeholder in the first region is self-aligned between opposite sidewalls of the STI liner. This self-alignment ensures that the backside placeholder can be precisely located without complicated masking.

According to an aspect of the disclosure, there is provided a semiconductor device. A non-limiting example semiconductor device includes a first region including nanosheets having a first width. The first region further includes a first S/D region and a second S/D region. The first S/D region is electrically coupled to a backside contact and the second S/D region is electrically coupled to a frontside contact. The semiconductor device includes a second region including nanosheets having a second width greater than the first width. The second region further includes a third S/D region and a fourth S/D region. The third S/D region is electrically coupled to a backside contact and the fourth S/D region is electrically coupled to a frontside contact. The semiconductor device further includes a backside placeholder having an air gap in the first region and a backside placeholder having a dimple in the second region. Advantageously, the respective backside placeholders prevent or mitigate damage to FEOL structures during the fabrication process.

In some embodiments, the backside placeholder in the second region does not include an air gap. Advantageously, the backside placeholder in the second region provides a physical signature of a dielectric placeholder replacement process.

In some embodiments, the second S/D region is between the respective frontside contact and the respective backside placeholder in the first region. The second S/D region provides electrical continuity to the device frontside.

In some embodiments, the backside placeholder in the first region includes a dimple. The dimple in the backside placeholder in the first region provides another physical signature of the dielectric placeholder replacement process.

According to an aspect of the disclosure, there is provided a semiconductor device. A non-limiting example semiconductor device includes a first region including nanosheets having a first width. The first region further includes a first S/D region and a second S/D region. The first S/D region is electrically coupled to a backside contact and the second S/D region is electrically coupled to a frontside contact. The semiconductor device includes a second region including nanosheets having a second width greater than the first width. The second region further includes a third S/D region and a fourth S/D region. The third S/D region is electrically coupled to a backside contact and the fourth S/D region is electrically coupled to a frontside contact. The semiconductor device further includes a backside placeholder having a filled pocket in the first region. The filled pocket includes a same material as a backside interlayer dielectric positioned opposite the second S/D region on the backside placeholder. The semiconductor device further includes a backside placeholder having a dimple in the second region. Advantageously, the respective backside placeholders prevent or mitigate damage to FEOL structures during the fabrication process.

In some embodiments, the backside placeholder in the second region does not include an air gap. Advantageously, the backside placeholder in the second region provides a physical signature of a dielectric placeholder replacement process.

In some embodiments, the second S/D region is between the respective frontside contact and the respective backside placeholder in the first region. The second S/D region provides electrical continuity to the device frontside.

In some embodiments, the backside placeholder in the first region includes a dimple. The dimple in the backside placeholder in the first region provides another physical signature of the dielectric placeholder replacement process. Advantageously, the dimple in the backside placeholder in the first region provides yet another physical signature of the dielectric placeholder replacement process.

It is understood in advance that although example embodiments of the disclosure are described in connection with a particular transistor architecture, embodiments of the disclosure are not limited to the particular transistor architectures or materials described in this specification. Rather, embodiments of the present disclosure are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present disclosure, ICs are fabricated in a series of stages, including a front-end-of-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another. Insulating dielectric materials are used throughout the layers of an IC to perform a variety of functions, including stabilizing the IC structure and providing electrical isolation of the IC elements. For example, the metal interconnecting wires in the BEOL region of the IC are isolated by dielectric layers to prevent the wires from creating a short circuit with other metal layers.

As discussed previously, a key component of the BEOL structure is the power delivery network (PDN). Backside power delivery, also referred to as a backside power delivery network (BSPDN), is a chip architecture that involves repositioning layers of the PDN from the top of the FEOL to the opposite side of the chip to free space on the front side for additional elements (e.g., more transistors). In other words, in a backside-style architecture the PDN layers are placed on the backside of the semiconductor substrate onto which the active devices have been built.

Some challenges remain, however, in effectively placing the various backside power rails and backside contacts (e.g., gate, source, and/or drain contacts) required to provide electrical continuity to the backside devices of these architectures. For example, the placement of a backside source/drain contact is difficult and relies upon a so-called backside placeholder (also referred to as the backside contact placeholder) that is built into the structure during the FEOL. The backside placeholder can then be opened post wafer flip to allow backside access to the source/drain and/or gate. To accomplish this, the backside placeholder is made of materials selected to provide etch selectivity with respect to the surrounding backside structures, for example, semiconductor materials such as SiGe. Unfortunately, the backside placeholder can be relatively small, for example less than 15 nm, and can be significantly damaged post-wafer flip when removing the backside substrate. To mitigate this effect, the backside placeholder can instead be made of more robust materials, including dielectrics such as SiC, but the formation of a dielectric placeholder during the FEOL will involve a dielectric fill, planarization (e.g., CMP), and recess process flow that may damage the device gate(s).

This disclosure introduces new fabrication methods and resulting structures for providing a backside placeholder dielectric fill to enable robust backside source/drain contacts. Rather than relying solely on semiconductors or dielectrics for the backside placeholder, aspects of this disclosure instead rely on a fabrication scheme that uses both. In some embodiments, the backside placeholder is initially made from semiconductor materials such as SiGe, but, during backside processing, the substrate is partially recessed to expose the backside placeholder and the semiconductor materials are replaced with dielectrics and/or metals. After the backside placeholder replacement, the remaining substrate can be completely removed. In this way, a robust backside S/D contact scheme can be provided even for relatively small nanosheet widths (e.g., those less than 15 nm).

Turning now to a more detailed description of fabrication operations and resulting structures according to aspects of the disclosure, FIG. 1A depicts a top-down reference view of a first region of a semiconductor wafer 100 after an initial set of fabrication operations (e.g., through FEOL, MOL, BEOL formation and carrier wafer bonding) have been applied as part of a method of fabricating a final semiconductor device according to one or more embodiments of the disclosure. FIG. 1B depicts a top-down reference view of a second region of the semiconductor wafer 100 after the initial set of fabrication operations. FIG. 1C depicts a cross-sectional view taken along the line X (across gate in channel region) in FIG. 1A. FIG. 1D depicts a cross-sectional view taken along the line Y1 (across channel in source/drain region) in FIG. 1A. In some embodiments, the first region denotes a region(s) having relatively smaller nanosheet widths (e.g., 15 nm or less for SRAM devices), while the second region denotes a region(s) having relatively larger, or nominal, nanosheet widths (e.g., 25 nm for logic).

As shown in FIGS. 1A-1D, various FEOL structures 102 have been built in the semiconductor wafer 100. The specific examples of the FEOL structures 102 are illustrative only and are not meant to be particularly limited. For example, the FEOL structures 102 depict a nanosheet-style transistor architecture. It should be understood, however, that the nanosheet-style transistor architecture of the FEOL structures 102 is provided for ease of discussion only and that other transistor architectures (e.g., vertical tunneling transistors, planar transistors, finFETs, etc.) are included in the contemplated scope of this disclosure. Other FEOL structures can be fabricated depending on the needs of a given application, and all such configurations are within the contemplated scope of this disclosure.

In some embodiments, the semiconductor wafer 100 includes one or more nanosheets 104 (collectively, a nanosheet stack(s)) and a gate 106 formed over channel regions of the one or more nanosheets 104. As used herein, a "channel region" refers to the portion of a nanosheet of the one or more nanosheets 104 over which the gate 106 is formed, and through which current passes from source to drain in the final device.

The semiconductor wafer 100 can include various additional FEOL, MOL, and BEOL structures, such as, for example, a bottom semiconductor layer 108, a backside placeholder 110 (also referred to as a backside placeholder), frontside contacts 112 (as shown, a frontside source/drain contact), inner spacers 114, gate spacers 116, a gate spacer footing 117, a shallow trench isolation (STI) region 118, first S/D regions 120, second S/D regions 122, third S/D regions 121, fourth S/D regions 123, and interlayer dielectrics (ILD) 124 (sometimes referred to as a frontside ILD). In some embodiments, semiconductor wafer 100 can include additional structures, such as, for example, a gate cap 126 (also referred to as a self-aligned or SAC cap), an STI liner 128, and a bottom spacer 130, configured and arranged as shown.

In some embodiments, the semiconductor wafer 100 includes a substrate 132 (e.g., Si) having an etch stop layer 134 (e.g., a buried oxide layer or a SiGe epi layer) and an additional semiconductor layer 136 (e.g., Si) over the etch stop layer 134, although other substrate configurations and materials are within the contemplated scope of this disclosure. In some embodiments, the substrate (e.g., substrate 132/134/136) includes a silicon-on-insulator (SOI) structure and the substrate 132 is a bottommost substrate layer.

In some embodiments, the backside placeholder 110 is made of a material selected to have etch selectivity with respect to the additional semiconductor layer 136 and/or the STI liner 128. For example, the backside placeholder 110 can include SiGe when the additional semiconductor layer 136 is silicon.

The first S/D regions 120 and the second S/D regions 122 can be made of the same materials or different materials, such as silicon and/or silicon germanium, and can be doped using the same or different dopants as needed. In some embodiments, the first S/D regions 120 are made of a first dopant type, and the second S/D regions 122 are made of a second dopant type. For example, the first S/D regions 120 can be silicon germanium doped with boron (SiGe:B) and the second S/D regions 122 can be silicon doped with phosphorus (Si:P), although other configurations are possible and within the contemplated scope of this disclosure.

In some embodiments, the BEOL structures of the semiconductor wafer 100 can further include an interconnect 138 (which itself can include any number of levels of vias and lines). The BEOL structures shown are merely illustrative and the semiconductor wafer 100 can include any number of BEOL structures (e.g., additional interconnect layers, vias, lines, etc.) and all such configurations are within the contemplated scope of this disclosure.

In some embodiments, a carrier wafer 140 is formed over the BEOL structures (e.g., the interconnect 138). The carrier wafer 140 can be made of a same or a different material as the substrate 132/134/136, such as silicon and/or a wafer handling material.

FIGS. 2A, 2B, and 2C depict cross-sectional views of the semiconductor wafer 100 taken along the lines X, Y1, and Y2, respectively, after a processing operation according to one or more embodiments. As shown in FIGS. 2A, 2B, and 2C, the substrate 132 and the etch stop layer 134 are removed. In some embodiments, the semiconductor wafer 100 is flipped and the substrate 132 is removed post-wafer flip. In some embodiments, removal of the substrate 132 lands (or stops) on the etch stop layer 134. For example, the substrate 132 can be removed by grinding and/or chemical-mechanical planarization (CMP), followed by dry etch and wet etch processes to remove substrate 132 (e.g., silicon), stopping on the etch stop layer 134. Note that the orientation of the semiconductor wafer 100 shown in FIGS. 2A and 2B remains fixed for ease of discussion. In some embodiments, the etch stop layer 134 is removed after stripping off the substrate 132 to expose portions of the additional semiconductor layer 136.

Figures 3A, 3B, 3C:
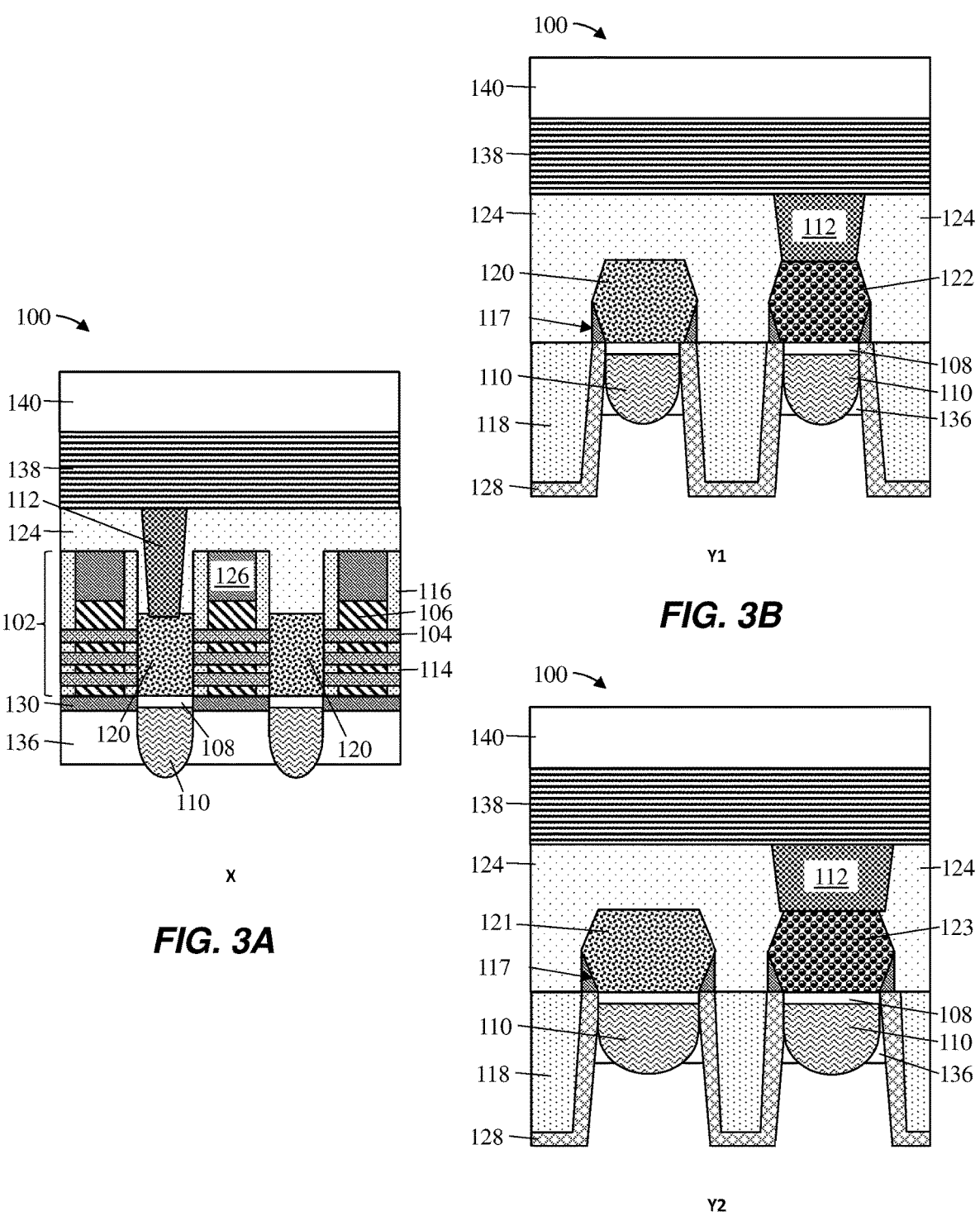
FIGS. 3A, 3B, and 3C depict cross-sectional views of the semiconductor wafer taken along the lines X, Y1, and Y2, respectively, after a processing operation according to one or more embodiments.

FIGS. 3A, 3B, and 3C depict cross-sectional views of the semiconductor wafer 100 taken along the lines X, Y1, and Y2, respectively, after a processing operation according to one or more embodiments. As shown in FIGS. 3A, 3B, and 3C, the exposed portions of the additional semiconductor layer 136 are then partially recessed. In some embodiments, portions of the additional semiconductor layer 136 are removed selective to the STI liner 128, and/or the backside placeholder 110. In this manner, the underlying structures (e.g., gate, S/D epi, etc.) can be preserved without risk of inadvertent damage. In some embodiments, the additional semiconductor layer 136 is partially recessed to expose a surface of the backside placeholder 110. Observe that, as the additional semiconductor layer 136 is only partially recessed at this time, damage to the backside placeholder 110 is mitigated (reduced to only that damage that can occur after the backside placeholder 110 is actually exposed).

Figures 4A, 4B, 4C:
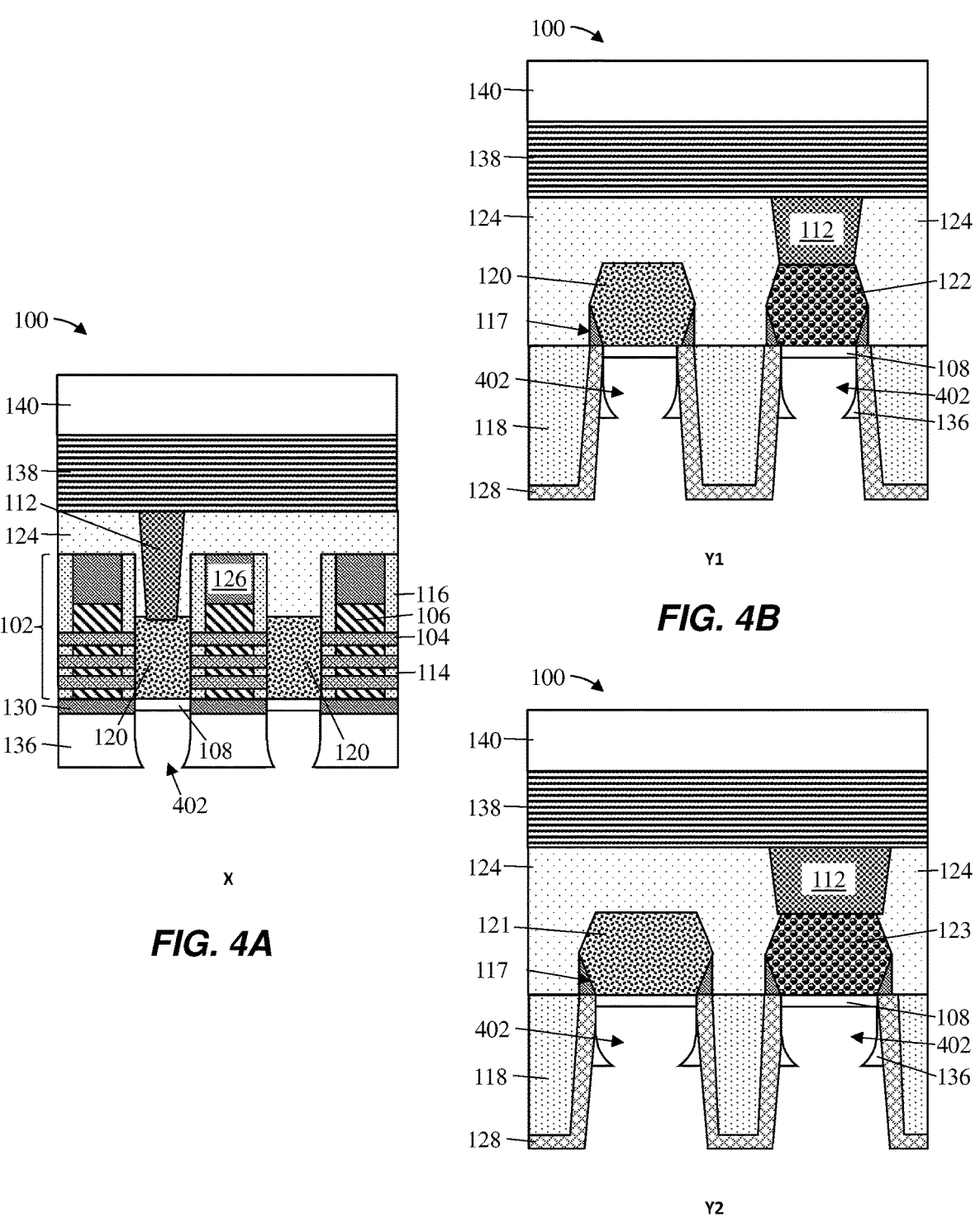
FIGS. 4A, 4B, and 4C depict cross-sectional views of the semiconductor wafer taken along the lines X, Y1, and Y2, respectively, after a processing operation according to one or more embodiments.

FIGS. 4A, 4B, and 4C depict cross-sectional views of the semiconductor wafer 100 taken along the lines X, Y1, and Y2, respectively, after a processing operation according to one or more embodiments. As shown in FIGS. 4A, 4B, and 4C, the exposed backside placeholder 110 is removed to define a backside placeholder trench 402. The backside placeholder 110 can be removed using, for example, a wet etch, a dry etch, or a combination of wet and/or dry etches. In some embodiments, the backside placeholder 110 can be removed selected to the bottom semiconductor layer 108 and/or STI liner 128. Observe that remaining portions of the additional semiconductor layer 136 restrict the size (width) of the opening of the backside placeholder trench 402. These remaining portions of the additional semiconductor layer 136 can serve to pinch off the backside placeholder trench 402 during later processing steps (refer to FIG. 5B).

Figures 5A, 5B, 5C:
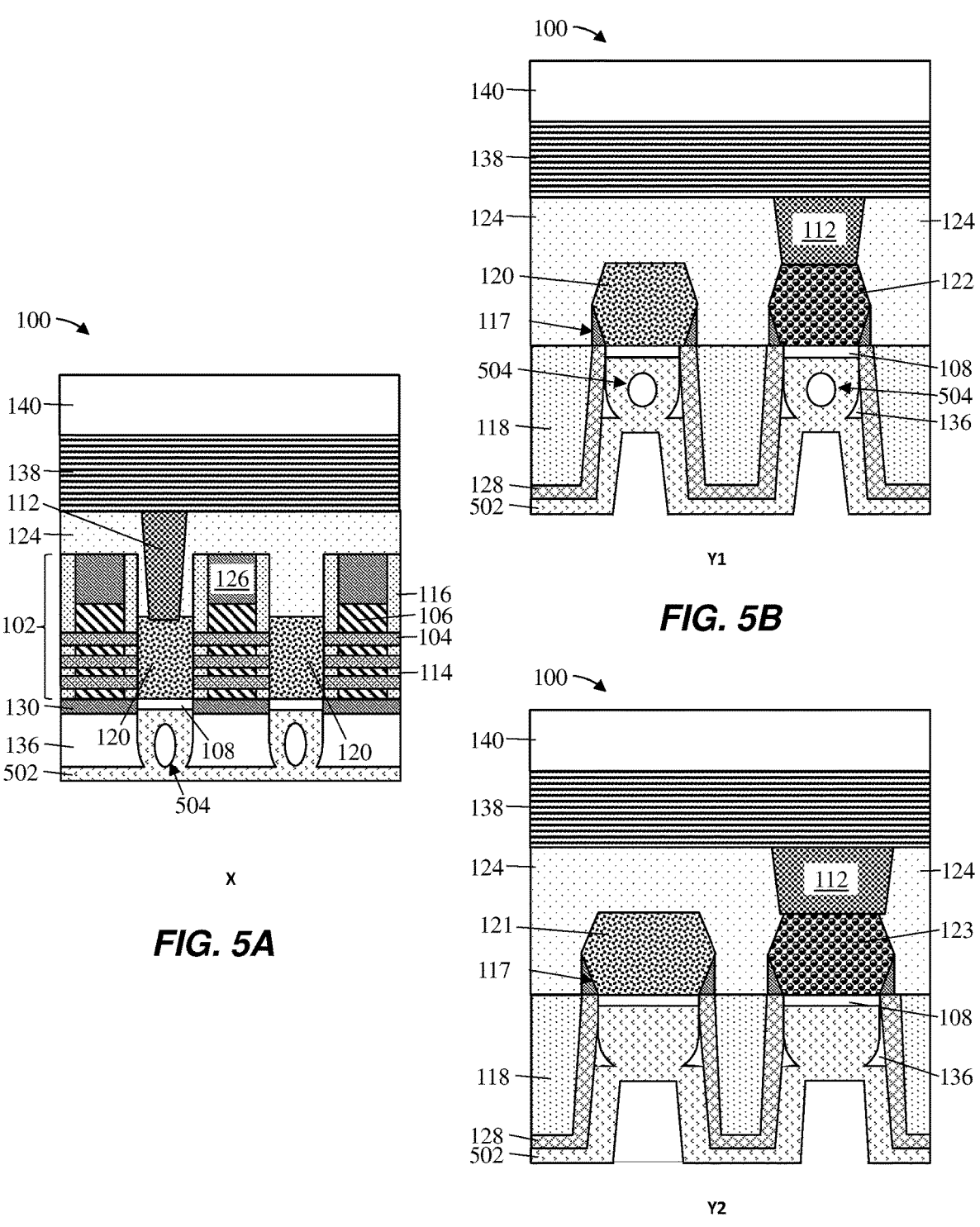
FIGS. 5A, 5B, and 5C depict cross-sectional views of the semiconductor wafer taken along the lines X, Y1, and Y2, respectively, after a processing operation according to one or more embodiments.

FIGS. 5A, 5B, and 5C depict cross-sectional views of the semiconductor wafer 100 taken along the lines X, Y1, and Y2, respectively, after a processing operation according to one or more embodiments. As shown in FIGS. 5A, 5B, and 5C, a backside liner 502 is formed over the semiconductor wafer 100. The backside liner 502 can include dielectrics and/or metal fill materials including, for example, SiC, GaAs, TiN, AlNx, TiOx, etc. In some embodiments, the backside liner 502 is a conformal liner deposited using, for example, physical vapor deposition (PVD), chemical vapor deposition (CVD), electrochemical deposition (ECD), molecular beam epitaxy (MBE), and/or atomic layer deposition (ALD).

Observe that the remaining portions of the additional semiconductor layer 136 in the first region (refer to FIG. 5B) are sufficient to cause the backside liner 502 to pinch-off in the backside placeholder trench 402, while remaining portions of the additional semiconductor layer 136 in the second region (refer to FIG. 5C) are not sufficient to cause the backside liner 502 to pinch-off in the backside placeholder trench 402. The result is the formation of an air gap 504 in the first region, but not in the second region and serves as a physical signature of the dielectric placeholder replacement scheme described herein. This result is somewhat intuitive, as the remaining portions of the additional semiconductor layer 136 in the first region make up a relatively large proportion of the total width of the relatively narrow opening of the backside placeholder trench 402 in the first region. The opening of the backside placeholder trench 402 in the second region, in contrast, is relatively wider as a consequence of the wider device characteristics in this region (e.g., wider nanosheets, etc.) and the remaining portions of the additional semiconductor layer 136 represent a smaller proportion of the opening of the backside placeholder trench 402 in the second region.

Figures 6A, 6B, 6C:
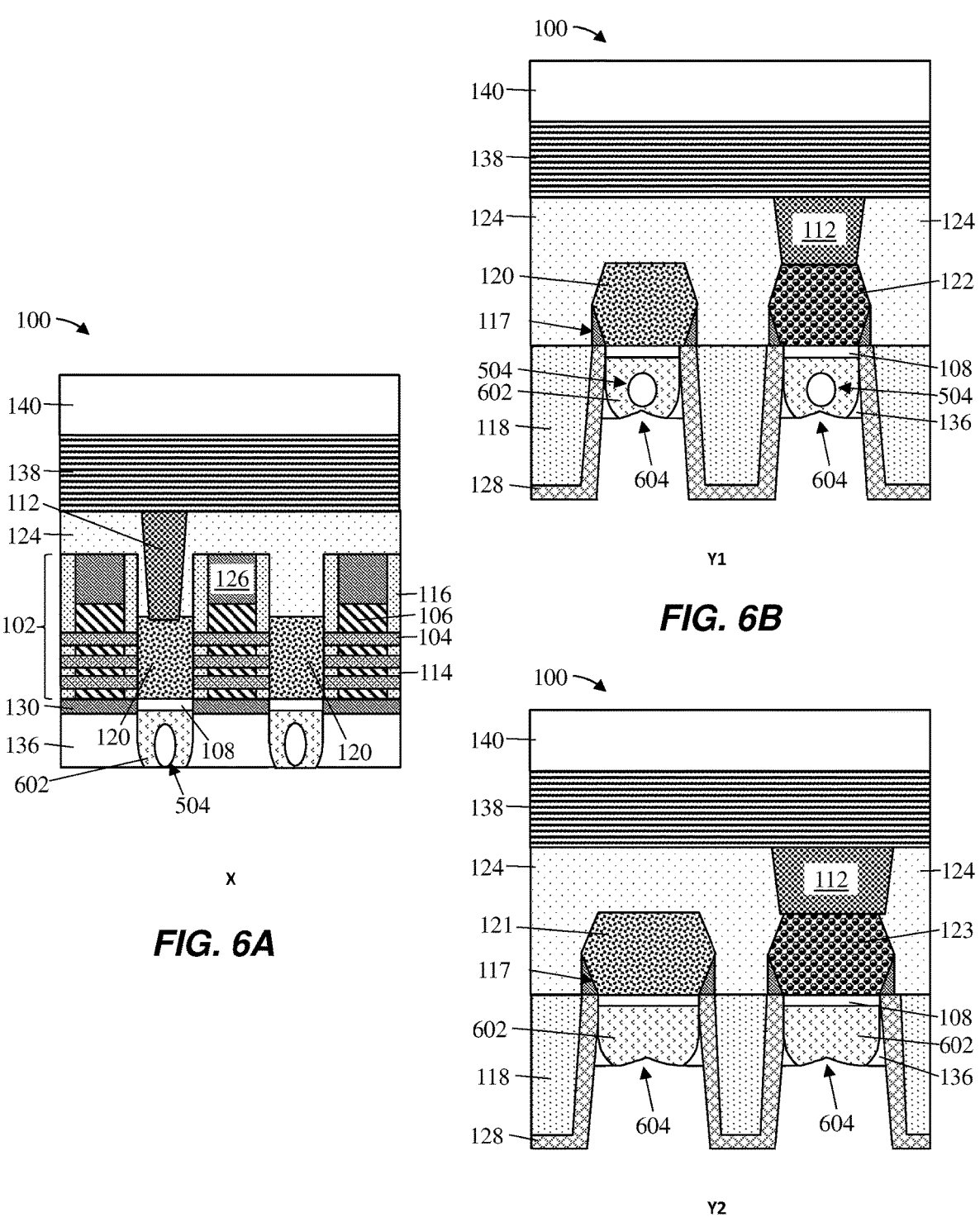
FIGS. 6A, 6B, and 6C depict cross-sectional views of the semiconductor wafer taken along the lines X, Y1, and Y2, respectively, after a processing operation according to one or more embodiments.

FIGS. 6A, 6B, and 6C depict cross-sectional views of the semiconductor wafer 100 taken along the lines X, Y1, and Y2, respectively, after a processing operation according to one or more embodiments. As shown in FIGS. 6A, 6B, and 6C, portions of the backside liner 502 are removed using, for example, an isotropic etch. The remaining portions of the backside liner 502 define a backside placeholder 602 in the backside placeholder trench 402. Observe that an isotropic etch of the backside liner 502 can result in dimples 604 (also referred to as inverse indents and/or as seams) in the backside placeholder 602. The presence of the dimples 604 serve as an additional physical signature of the dielectric placeholder replacement scheme described herein. The backside placeholder 602 remains in the final device and can be referred to as a permanent or replacement backside placeholder. In contrast, the backside placeholder 110 can be referred to as a sacrificial backside placeholder.

Figures 7A, 7B, 7C:
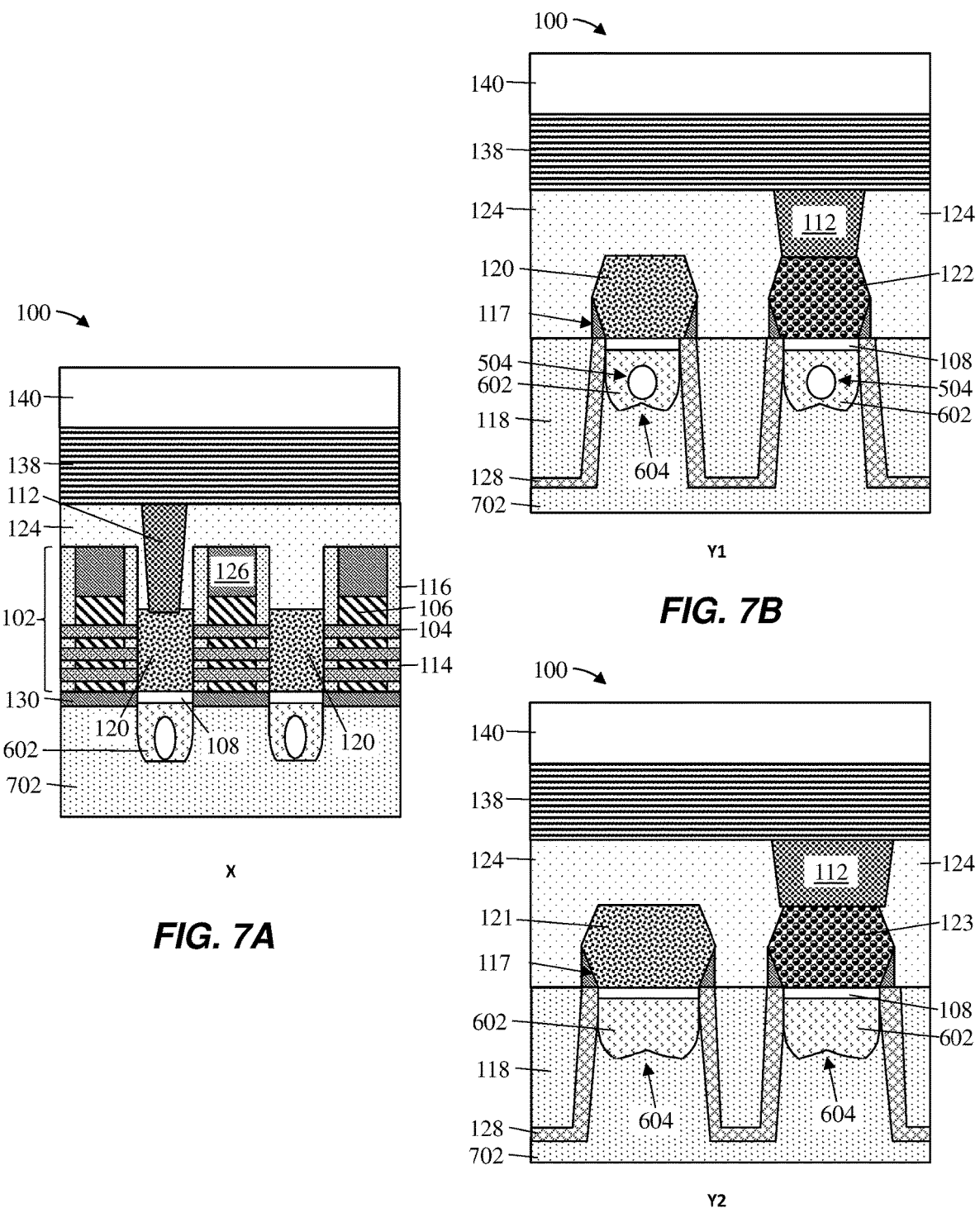
FIGS. 7A, 7B, and 7C depict cross-sectional views of the semiconductor wafer taken along the lines X, Y1, and Y2, respectively, after a processing operation according to one or more embodiments.

FIGS. 7A, 7B, and 7C depict cross-sectional views of the semiconductor wafer 100 taken along the lines X, Y1, and Y2, respectively, after a processing operation according to one or more embodiments. As shown in FIGS. 7A, 7B, and 7C, the remaining portions of the additional semiconductor layer 136 are removed and replaced with a backside interlayer dielectric (BILD) 702. The BILD 702 can be made from any suitable dielectric material, such as, for example, a low-k dielectric, a nitride, silicon nitride, silicon oxide, SiON, SiC, SiOCN, SiBCN, etc. In some embodiments, the BILD 702 is made of a material selected to allow for etch selectivity with respect to the backside placeholder 602 and/or the STI liner 128. Advantageously, as described previously, the backside placeholder 602 is made of dielectrics and/or metals that prevent damage to the FEOL structures exposed or potentially exposed via the backside of the semiconductor wafer 100 during this process.

Figures 8A, 8B, 8C:
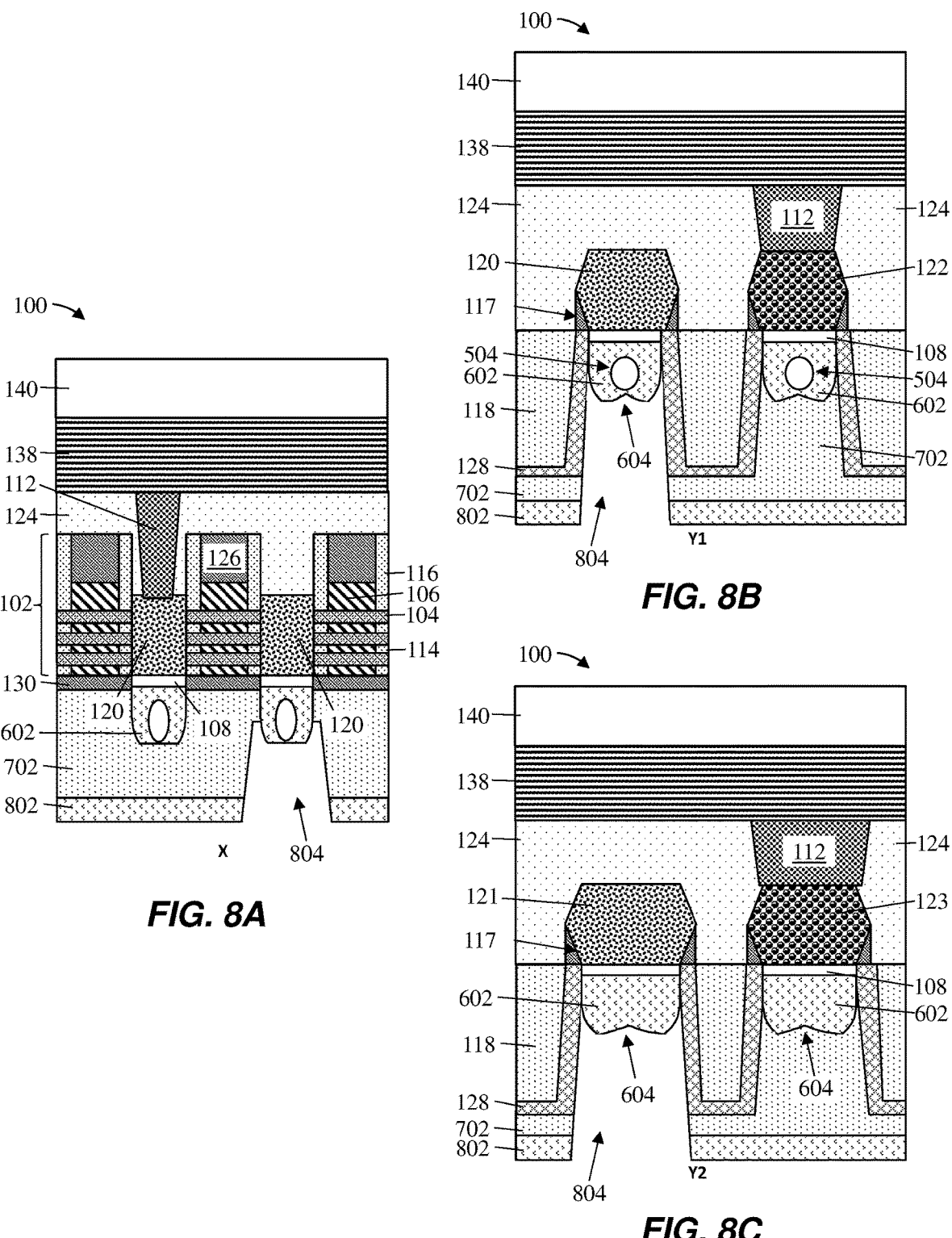
FIGS. 8A, 8B, and 8C depict cross-sectional views of the semiconductor wafer taken along the lines X, Y1, and Y2, respectively, after a processing operation according to one or more embodiments.

FIGS. 8A, 8B, and 8C depict cross-sectional views of the semiconductor wafer 100 taken along the lines X, Y1, and Y2, respectively, after a processing operation according to one or more embodiments. As shown in FIGS. 8A, 8B, and 8C, a patterning film stack 802 can be formed over the semiconductor wafer 100. The patterning film stack can be a bi-layer stack, a tri-layer stack, or a multilayer stack including an organic planarization layer (OPL), an antireflective coating, and/or a topmost photoresist layer (internal layers not separately shown). Patterning layer stacks typically include OPLs because high resolution photoresists themselves often do not provide enough etch resistance for pattern transfer. OPLs are used as etch masks for pattern transfers into inorganic substrates, to fill pre-existing features, and to planarize the substrate to allow for larger patterning process windows.

The patterning film stack 802 can be formed over a surface of the semiconductor wafer 100 using any suitable process. In some embodiments, the patterning film stack 802 includes an OPL that can be applied using, for example, spin coating technology. In some embodiments, the patterning film stack 802 can include a photo-sensitive organic polymer having a light-sensitive material that, when exposed to electromagnetic (EM) radiation, is chemically altered and thus configured to be removed using a developing solvent.

For example, the photo-sensitive organic polymer can be polyacrylate resin, epoxy resin, phenol resin, polyamide resin, polyimide resin, unsaturated polyester resin, polyphenylenether resin, polyphenylenesulfide resin, or benzocyclobutene (BCB). More generally, for example, the patterning film stack 802 can include any organic polymer and a photo-active compound having a molecular structure that can attach to the molecular structure of the organic polymer. In some embodiments, the patterning film stack 802 includes OPL material(s) selected to be compatible with the overlying antireflective coating (if present), the overlying photoresist (if present), and the lithographic wavelength employed (e.g., ArF, KrF, etc.).

The antireflective coating can be made of any suitable antireflective material, such as, for example, a low temperature oxide (LTO), SiARC, TiARC, or SiON. The antireflective coating can be deposited using, for example, a spin-on process. The photoresist can include any suitable photoresist material, such as, for example, 248 nm resists, 193 nm resists, 157 nm resists, or EUV (extreme ultraviolet) resists. In some embodiments, the photoresist can be made of a light sensitive polymer, and can be deposited using any suitable resist process, such as spin-on coating.

As further depicted in FIGS. 8A, 8B, and 8C, an OPL open 804 can be formed in the patterning film stack 802 over and to expose portions of the backside placeholder 602. This process can be referred to as backside contact patterning. In some embodiments, a photoresist can be patterned (opened) by exposure to a photo-lithography developing solvent to expose a surface of an antireflective coating. The pattern in the photoresist can be transferred to the underlying antireflective coating using a dry etch process. The pattern in the antireflective coating can be transferred to the underlying OPL using, for example, a wet etch, a dry etch, or a combination of wet and/or dry etches.

Figures 9A, 9B, 9C:
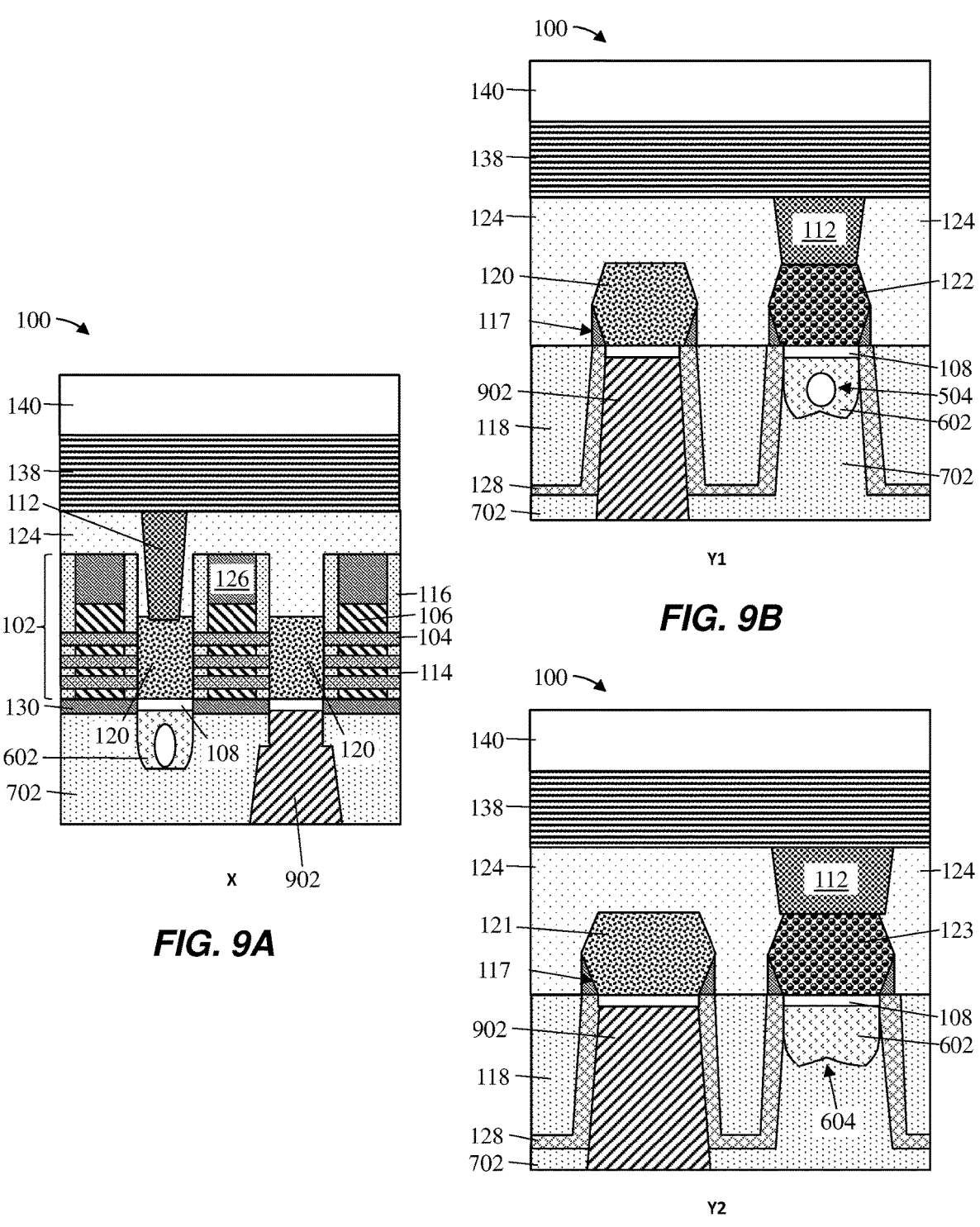
FIGS. 9A, 9B, and 9C depict cross-sectional views of the semiconductor wafer taken along the lines X, Y1, and Y2, respectively, after a processing operation according to one or more embodiments.

FIGS. 9A, 9B, and 9C depict cross-sectional views of the semiconductor wafer 100 taken along the lines X, Y1, and Y2, respectively, after a processing operation according to one or more embodiments. As shown in FIGS. 9A, 9B, and 9C, the exposed backside placeholder 602 is removed and the OPL open 804 is filled with conductive material (e.g., metals, doped semiconductors, etc.) to define a backside contact 902 (also referred to as a backside S/D contact). This process can be referred to as the backside S/D contact metallization.

In some embodiments, the bottom semiconductor layer 108 is removed alongside the backside placeholder 602 (not separately shown). In some embodiments, the patterning film stack 802 is removed following the formation of the backside contact 902.

Figures 10A, 10B, 10C:
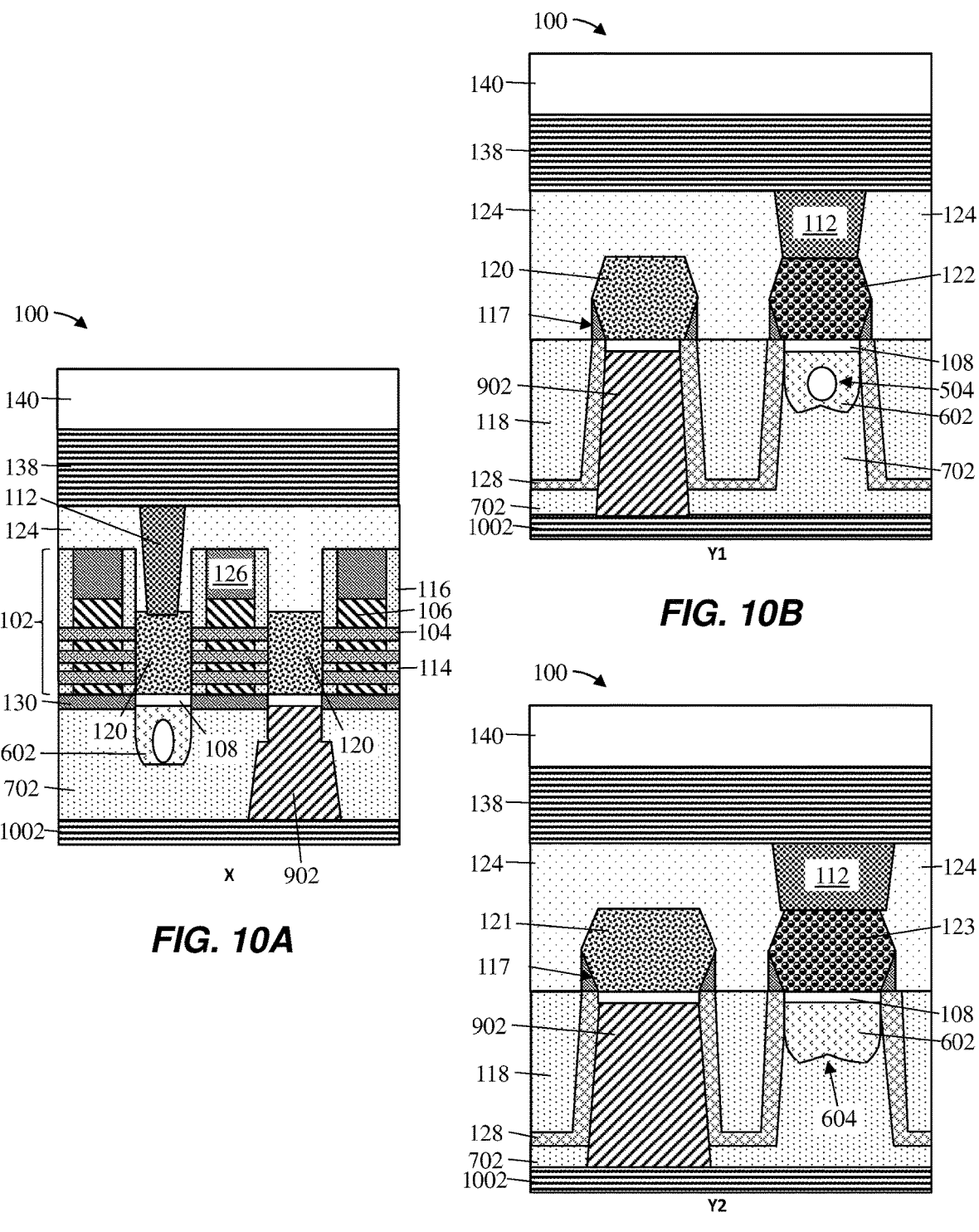
FIGS. 10A, 10B, and 10C depict cross-sectional views of the semiconductor wafer taken along the lines X, Y1, and Y2, respectively, after a processing operation according to one or more embodiments.

FIGS. 10A, 10B, and 10C depict cross-sectional views of the semiconductor wafer 100 taken along the lines X, Y1, and Y2, respectively, after a processing operation according to one or more embodiments. As shown in FIGS. 10A, 10B, and 10C, additional backside processing can include forming a backside power delivery network (BSPDN) 1002 over the semiconductor wafer 100. The backside power delivery network 1002 can include any number of conductive/metal layers, lines, and vias, and can be formed in a similar manner as the BEOL interconnect structures (e.g., interconnect 138) discussed previously, except that the backside power delivery network 1002 is formed on an opposite side of the semiconductor wafer 100. Additional backside layers and dielectrics (omitted for clarity) can be formed before or after the backside power delivery network 1002.

After backside processing is complete, the semiconductor wafer 100 can be finalized using known processes (e.g., additional BEOL, far back end of line (FBEOL), and packaging processes used to define a final device, including the incorporation of additional frontside and/or backside metallization layers).

Figures 11A, 11B, 11C:
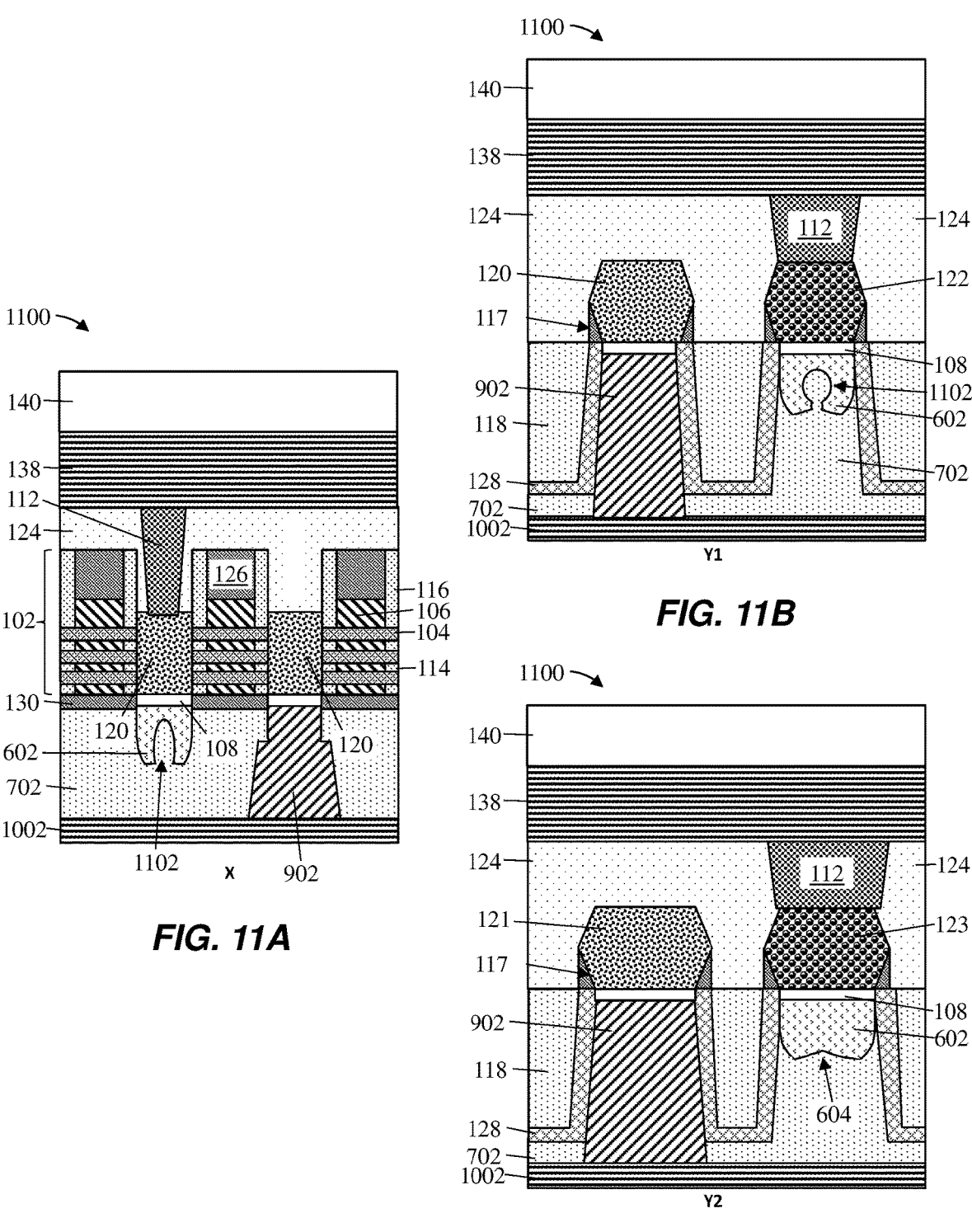
FIGS. 11A, 11B, and 11C depict cross-sectional views of a semiconductor wafer taken along the lines X, Y1, and Y2, respectively, after a set of processing operations according to one or more embodiments.

FIGS. 11A, 11B, and 11C depict cross-sectional views of a semiconductor wafer 1100 taken along the lines X, Y1, and Y2, respectively, after a set of processing operations according to one or more embodiments. The semiconductor wafer 1100 can be formed in a similar manner as the semiconductor wafer 100 discussed previously, except that the air gap 504 is breached when portions of the backside liner 502 are removed during the isotropic etch (refer to FIGS. 5A-5C and FIGS. 6A-6C). The result is a filled pocket 1102 within the backside placeholder 602 that includes the same material as the BILD 702. Observe that this occurs in the first region, but not the second region, of the semiconductor wafer 1100 and serves as yet another physical signature of the dielectric placeholder replacement scheme described herein.

Figures 12A, 12B, 12C:
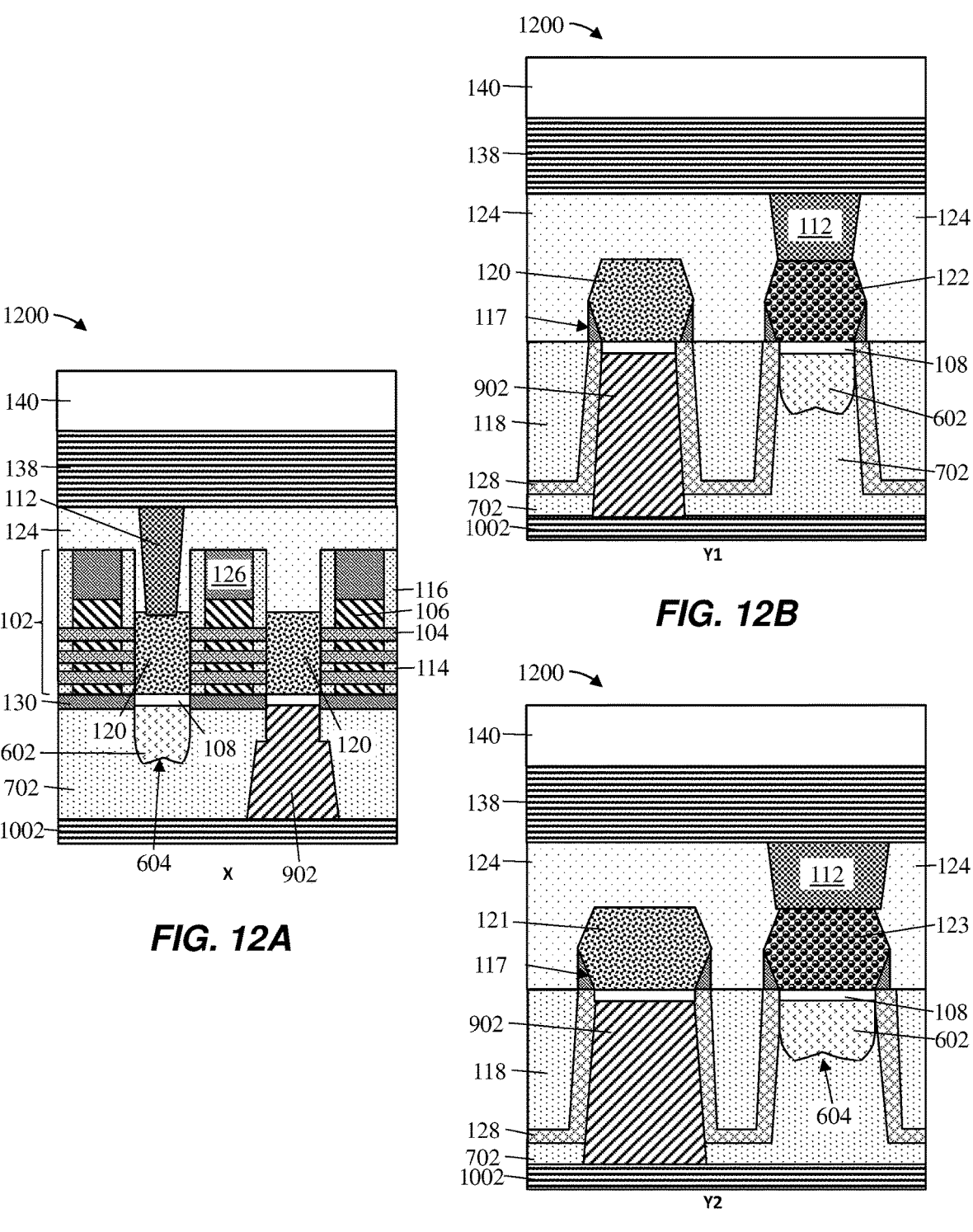
FIGS. 12A, 12B, and 12C depict cross-sectional views of a semiconductor wafer taken along the lines X, Y1, and Y2, respectively, after a set of processing operations according to one or more embodiments.

FIGS. 12A, 12B, and 12C depict cross-sectional views of a semiconductor wafer 1200 taken along the lines X, Y1, and Y2, respectively, after a set of processing operations according to one or more embodiments. The semiconductor wafer 1200 can be formed in a similar manner as the semiconductor wafer 100 discussed previously, except that an air gap 504 does not form when depositing the backside liner 502 (refer to FIGS. 5A-5C). This can occur, for example, when the pinch-off of dielectric material collapses and/or when the opening is sufficiently wide enough that the backside placeholder trench 402 is completely filled. Note that, even though the air gap 504 is not formed, the dimples 604 still serve as a physical signature of the dielectric placeholder replacement scheme described herein.

Figure 13:
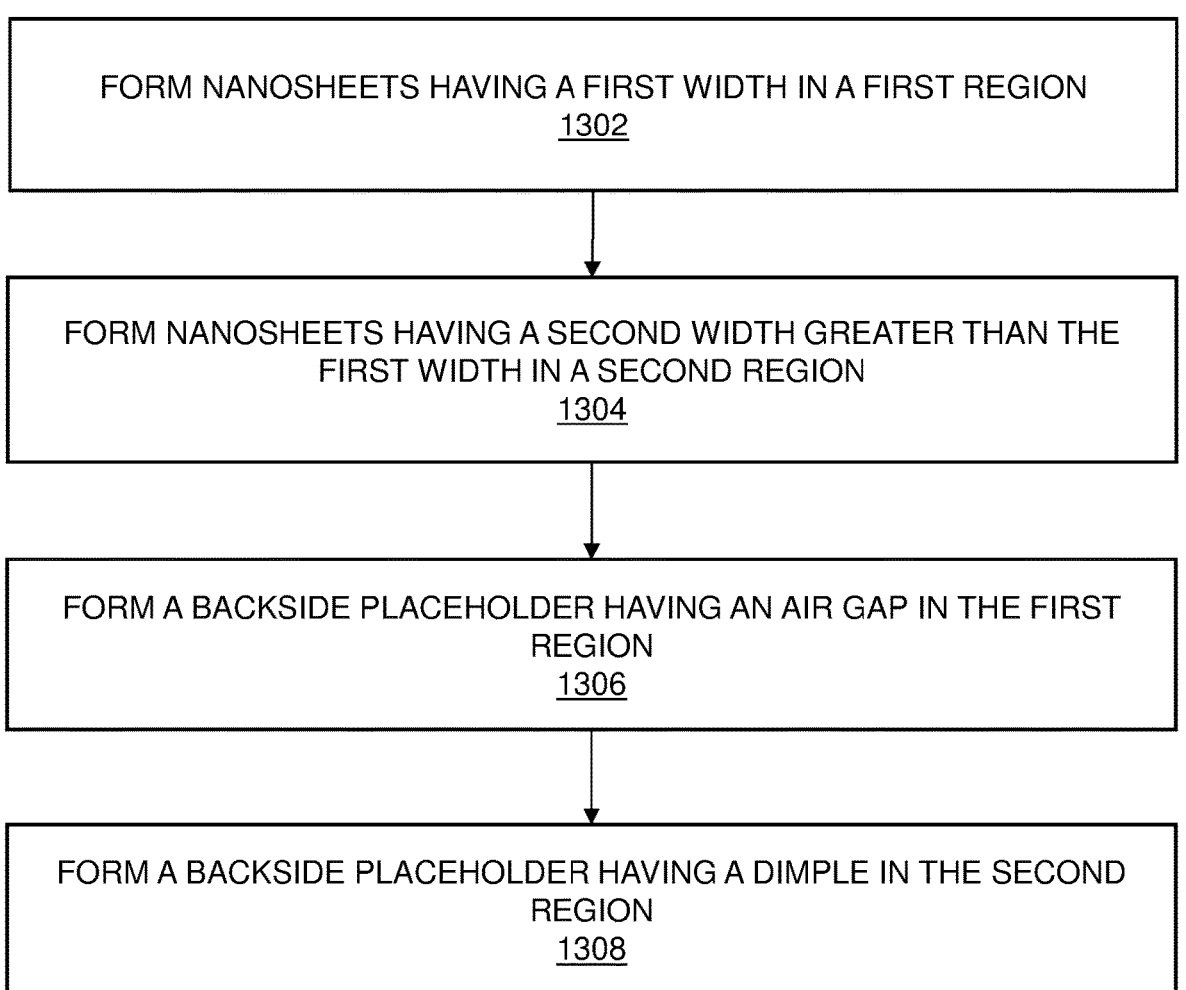
FIG. 13 depicts a flow diagram illustrating a method according to one or more embodiments.

FIG. 13 depicts a flow diagram illustrating a method 1300 for providing a backside placeholder dielectric fill to enable robust backside source/drain contacts according to one or more embodiments of the disclosure. The method 1300 is described in reference to FIGS. 1A-12C and may include additional blocks not depicted in FIG. 13. Although depicted in a particular order, the blocks depicted in FIG. 13 can be rearranged, subdivided, and/or combined.

As shown at block 1302, the method includes forming nanosheets having a first width in a first region. In some embodiments, the first region includes a first S/D region and a second S/D region. In some embodiments, the first S/D region is electrically coupled to a backside contact and the second S/D region is electrically coupled to a frontside contact.

In some embodiments, the second S/D region is between the respective frontside contact and the respective backside placeholder in the first region.

As shown at block 1304, the method includes forming nanosheets having a second width in a second region. In some embodiments, second width is greater than the first width. In some embodiments, the second region further includes a third S/D region and a fourth S/D region. In some embodiments, the third S/D region is electrically coupled to a backside contact and the fourth S/D region is electrically coupled to a frontside contact.

As shown at block 1306, the method includes forming a backside placeholder having an air gap in the first region. In some embodiments, the backside placeholder in the first region includes a dimple.

In some embodiments, forming the backside placeholder in the first region includes forming a first backside placeholder using a first material and replacing the first backside placeholder with a second backside placeholder having a second material different than the first material.

In some embodiments, the method includes recessing a semiconductor layer to expose a portion of the first backside placeholder. In some embodiments, the method includes removing the first backside placeholder to define a backside placeholder trench. In some embodiments, the method includes filling the backside placeholder trench with the second material.

In some embodiments, the air gap is formed when filling the backside placeholder trench with the second material. In some embodiments, the air gap is formed due to a pinch-off caused in part by remaining portions of the recessed semiconductor layer.

As shown at block 1308, the method includes forming a backside placeholder having a dimple in the second region. In some embodiments, the backside placeholder in the second region does not include an air gap.

In some embodiments, the first backside placeholder is formed prior to forming a carrier wafer and flipping the semiconductor device, and the second backside placeholder is formed after forming the carrier wafer and flipping the semiconductor device.

In some embodiments, the method includes forming an STI region and an STI liner on the STI region. In some embodiments, the backside placeholder in the first region is self-aligned between opposite sidewalls of the STI liner.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present disclosure are described herein with reference to the related drawings. Alternative embodiments can be devised without departing from the scope of this disclosure. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present disclosure is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop (i.e., the second element remains).

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a <100> orientated crystalline surface can take on a <100> orientation. In some embodiments of the disclosure of the disclosure, epitaxial growth and/or deposition processes can be selective to forming on semiconductor surface, and may or may not deposit material on other exposed surfaces, such as silicon dioxide or silicon nitride surfaces.

As used herein, "p-type" refers to the addition of impurities to an intrinsic semiconductor that creates deficiencies of valence electrons. In a silicon-containing substrate, examples of p-type dopants, i.e., impurities, include but are not limited to, boron, aluminum, gallium, and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present disclosure will now be provided. Although specific fabrication operations used in implementing one or more embodiments of the present disclosure can be individually known, the described combination of operations and/or resulting structures of the present disclosure are unique. Thus, the unique combination of the operations described in connection with the fabrication of a semiconductor device according to the present disclosure utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present disclosure. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present disclosure have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:

forming nanosheets having a first width in a first region, the first region comprising a first source or drain (S/D) region and a second S/D region, wherein the first S/D region is electrically coupled to a backside contact and the second S/D region is electrically coupled to a frontside contact;

forming nanosheets having a second width in a second region, the second width greater than the first width, the second region further comprising a third S/D region and a fourth S/D region, wherein the third S/D region is electrically coupled to a backside contact and the fourth S/D region is electrically coupled to a frontside contact;

forming a backside placeholder comprising an air gap in the first region; and forming a backside placeholder comprising a dimple in the second region.

2. The method of claim 1, wherein the backside placeholder in the second region does not include an air gap.

3. The method of claim 1, wherein the second S/D region is between the respective frontside contact and the respective backside placeholder in the first region.

4. The method of claim 3, wherein the backside placeholder in the first region comprises a dimple.

5. The method of claim 1, wherein forming the backside placeholder in the first region comprises:

forming a first backside placeholder comprising a first material; and replacing the first backside placeholder with a second backside placeholder comprising a second material different than the first material.

6. The method of claim 5, further comprising recessing a semiconductor layer to expose a portion of the first backside placeholder.

7. The method of claim 6, further comprising removing the first backside placeholder to define a backside placeholder trench.

8. The method of claim 7, further comprising filling the backside placeholder trench with the second material.

9. The method of claim 8, wherein the air gap is formed when filling the backside placeholder trench with the second material.

10. The method of claim 9, wherein the air gap is formed due to a pinch-off caused in part by remaining portions of the recessed semiconductor layer.

11. The method of claim 5, wherein the first backside placeholder is formed prior to forming a carrier wafer and flipping the semiconductor device, and wherein the second backside placeholder is formed after forming the carrier wafer and flipping the semiconductor device.

12. The method of claim 1, further comprising forming a shallow trench isolation (STI) region and an STI liner on the STI region, wherein the backside placeholder in the first region is self-aligned between opposite sidewalls of the STI liner.

13. A semiconductor device comprising:

a first region comprising nanosheets having a first width, the first region further comprising a first source or drain (S/D) region and a second S/D region, wherein the first S/D region is electrically coupled to a backside contact and the second S/D region is electrically coupled to a frontside contact;

a second region comprising nanosheets having a second width, the second width greater than the first width, the second region further comprising a third S/D region and a fourth S/D region, wherein the third S/D region is electrically coupled to a backside contact and the fourth S/D region is electrically coupled to a frontside contact;

a backside placeholder comprising an air gap in the first region; and a backside placeholder comprising a dimple in the second region.

14. The semiconductor device of claim 13, wherein the backside placeholder in the second region does not include an air gap.

15. The semiconductor device of claim 13, wherein the second S/D region is between the respective frontside contact and the respective backside placeholder in the first region.

16. The semiconductor device of claim 15, wherein the backside placeholder in the first region comprises a dimple.

17. A semiconductor device comprising:

a first region comprising nanosheets having a first width, the first region further comprising a first source or drain (S/D) region and a second S/D region, wherein the first S/D region is electrically coupled to a backside contact and the second S/D region is electrically coupled to a frontside contact;

a second region comprising nanosheets having a second width, the second width greater than the first width, the second region further comprising a third S/D region and a fourth S/D region, wherein the third S/D region is electrically coupled to a backside contact and the fourth S/D region is electrically coupled to a frontside contact;

a backside placeholder comprising a filled pocket in the first region, the filled pocket comprising a same material as a backside interlayer dielectric positioned opposite the second S/D region on the backside placeholder; and a backside placeholder comprising a dimple in the second region.

18. The semiconductor device of claim 17, wherein the backside placeholder in the second region does not include an air gap.

19. The semiconductor device of claim 17, wherein the second S/D region is between the respective frontside contact and the respective backside placeholder in the first region.

20. The semiconductor device of claim 19, wherein the backside interlayer dielectric extends into the filled pocket.

* * * * *